US010678076B2

(12) United States Patent
Hallam et al.

(10) Patent No.: US 10,678,076 B2
(45) Date of Patent: Jun. 9, 2020

(54) TREATING DISPLAY PANEL USING LASER (71) Applicant: Facebook Technologies, LLC, Menlo Park, CA (US)

(72) Inventors: Simon Hallam, San Jose, CA (US); Ye Yin, Pleasanton, CA (US); Evan M. Richards, Santa Clara, CA (US); Shizhe Shen, San Mateo, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 317 days.

(21) Appl. No.: 15/419,939

(22) Filed: Jan. 30, 2017

(65) Prior Publication Data

US 2018/0217416 A1 Aug. 2, 2018

(51) Int. Cl.
*G02F 1/13* (2006.01)
*B23K 26/351* (2014.01)
*B23K 26/073* (2006.01)
*B23K 26/03* (2006.01)
*B23K 26/352* (2014.01)
*B23K 101/36* (2006.01)

(52) U.S. Cl.
CPC .......... *G02F 1/1309* (2013.01); *B23K 26/032* (2013.01); *B23K 26/073* (2013.01); *B23K 26/351* (2015.10); *B23K 26/352* (2015.10); *B23K 2101/36* (2018.08); *H01L 2251/568* (2013.01)

(58) Field of Classification Search
None
See application file for complete search history.

(56) References Cited

U.S. PATENT DOCUMENTS

| | | | | |
|---|---|---|---|---|
| 2002/0101558 A1* | 8/2002 | Nemeth | ............... | G02F 1/1309 349/192 |
| 2003/0222861 A1* | 12/2003 | Nishikawa | ............. | G09G 3/006 345/204 |
| 2004/0082252 A1* | 4/2004 | Liao | ........................ | G01N 21/94 445/61 |
| 2004/0097160 A1* | 5/2004 | Kaltenbach | ............. | H01L 51/56 445/3 |
| 2005/0023523 A1* | 2/2005 | Kawaguchi | ........... | H01L 27/322 257/40 |
| 2005/0078235 A1* | 4/2005 | Ozaki | ............... | G02F 1/136259 349/55 |
| 2005/0215163 A1* | 9/2005 | Tamura | ................... | H01L 51/56 445/24 |
| 2006/0076555 A1* | 4/2006 | Liao | ....................... | G01M 11/00 257/40 |

(Continued)

*Primary Examiner* — Erik T. K. Peterson
(74) *Attorney, Agent, or Firm* — Fenwick & West LLP (57) ABSTRACT

An apparatus for treating pixels or regions of a display panel includes a measuring device configured to measure a parameter of light emitted by one or more pixels of each region of the display panel. The apparatus includes a parameter comparator operably coupled to the measuring device and configured to select one or more pixels or one or more regions of the display panel such that the measured parameter of light emitted by the one or more pixels or the one or more regions exceeds a threshold value. The apparatus also includes a laser device configured to emit a laser beam onto the selected one or more pixels or the selected one or more regions.

12 Claims, 6 Drawing Sheets

(56) References Cited

U.S. PATENT DOCUMENTS

| | | | | |
|---|---|---|---|---|
| 2006/0214575 | A1* | 9/2006 | Kajiyama | H01L 27/3244 313/506 |
| 2008/0233826 | A1* | 9/2008 | Matsuda | H01L 51/56 445/2 |
| 2009/0061720 | A1* | 3/2009 | Fujimaki | H01L 51/56 445/2 |
| 2011/0027918 | A1* | 2/2011 | Tanaka | G09G 3/006 438/16 |
| 2012/0002155 | A1* | 1/2012 | Lin | G02F 1/136259 349/192 |
| 2012/0071056 | A1* | 3/2012 | Oka | B23K 26/032 445/2 |
| 2012/0077408 | A1* | 3/2012 | Tajima | G02F 1/1303 445/2 |
| 2012/0103955 | A1* | 5/2012 | Hyun | B23K 26/0648 219/121.83 |
| 2012/0264235 | A1* | 10/2012 | Hiraoka | H01L 51/56 438/4 |
| 2013/0102094 | A1* | 4/2013 | Hiraoka | H01L 51/56 438/16 |
| 2014/0068925 | A1* | 3/2014 | Park | G02F 1/1309 29/593 |
| 2014/0256205 | A1* | 9/2014 | Cordingley | G02F 1/1309 445/2 |
| 2016/0126458 | A1* | 5/2016 | Hiraoka | C09K 11/06 257/40 |
| 2016/0370614 | A1* | 12/2016 | Blanchette | G02F 1/1309 |

* cited by examiner

TREATING DISPLAY PANEL USING LASER

BACKGROUND

Field of the Disclosure

The present disclosure generally relates to electronic display panels, and specifically to treating electronic display panels using a laser.

Description of the Related Arts

An electronic display panel includes a display surface having pixels that display a portion of an image by emitting light from one or more subpixels. During the manufacturing process, various factors cause non-uniformities in the intensity of light emitted by pixels and subpixels. For example, variations in flatness of a carrier substrate, variations in a lithography light source, temperature variations across the substrate, or mask defects may result in the electronic display panel having transistors with non-uniform emission characteristics. Moreover, transistors of different subpixels may have different VI characteristics. As a result, different subpixels driven with the same voltage and current will emit different intensities of light (also referred to as brightness). Variations that are a function of position and individual subpixels on the electronic display panel cause different display regions of the electronic display panel to have a different brightness. If these errors systematically affect subpixels of one color more than subpixels of another color, then the electronic display panel has non-uniform color balance as well. These spatial non-uniformities of brightness decrease image quality and limit applications of the electronic display panel. For example, virtual reality (VR) systems typically include an electronic display panel that presents virtual reality images. These spatial non-uniformities reduce user experience and immersion in a VR environment.

SUMMARY

Embodiments relate to altering the intensity characteristics of an electronic display panel using a laser beam. An apparatus for treating pixels or regions of a display panel includes a measuring device configured to measure a parameter of light emitted by one or more pixels of each region of one or more regions of the display panel. The apparatus includes a parameter comparator operably coupled to the measuring device and configured to select one or more pixels or one or more regions of the display panel, such that the measured parameter of light emitted by the one or more pixels or the one or more regions exceeds a threshold value. The apparatus includes a laser device configured to emit a laser beam onto the selected one or more pixels or the selected one or more regions.

In one embodiment, a controller is operably coupled to the parameter comparator to receive location information corresponding to the selected one or more pixels or the selected one or more regions. An actuator is operated by the controller to cause the laser device to emit the laser beam onto the selected one or more pixels or the selected one or more regions.

In one embodiment, the measuring device is a photometer, a photodiode, a radiometer, or a colorimeter.

In one embodiment, the parameter of light is at least one of luminance, radiance, and chrominance.

In one embodiment, an actuator operated by the controller moves the measuring device in a direction parallel to a display surface of the display panel.

In one embodiment, the controller operates the laser device to perform a plurality of cycles of treatment on the display panel. The laser device emits the laser beam onto regions of different sizes in at least two of the plurality of cycles.

In one embodiment, the controller is further configured to cause the laser device to emit light onto one or more pixels or one or more regions of a second display panel for pairing with the display panel such that mismatch of the measured parameter of light emitted by pixels and regions in the second display panel relative to the measured parameter of light emitted by corresponding pixels or regions in the display panel is below a second threshold value.

In one embodiment, the threshold value increases as the average of the measured parameter of light across all the pixels of the display panel increases.

BRIEF DESCRIPTION OF THE DRAWINGS

The teachings of the embodiments can be readily understood by considering the following detailed description in conjunction with the accompanying drawings.

The figures depict various embodiments of the present invention for purposes of illustration only. One skilled in the art will readily recognize from the following discussion that alternative embodiments of the structures and methods illustrated herein may be employed without departing from the principles described herein.

DETAILED DESCRIPTION

In the following description of embodiments, numerous specific details are set forth in order to provide more thorough understanding. However, note that the present invention may be practiced without one or more of these specific details. In other instances, well-known features have not been described in detail to avoid unnecessarily complicating the description.

A preferred embodiment is described herein with reference to the figures where like reference numbers indicate identical or functionally similar elements. Also in the figures, the left most digits of each reference number corresponds to the figure in which the reference number is first used.

Embodiments relate to treating an electronic display panel using a laser to reduce non-uniformities between areas of the display. A system to treat pixels or regions (including one or more pixels) of a display panel includes a measuring device to measure a parameter of light (such as intensity) emitted by pixels of each region. A parameter comparator selects a pixel or a region of the display panel having a parameter of light above a threshold value. A laser device emits a laser beam incident on the selected pixel or region of the display panel to burn the selected pixel or region to reduce brightness of the selected pixel or region.

Example Electronic Display Panel

Figure 1:
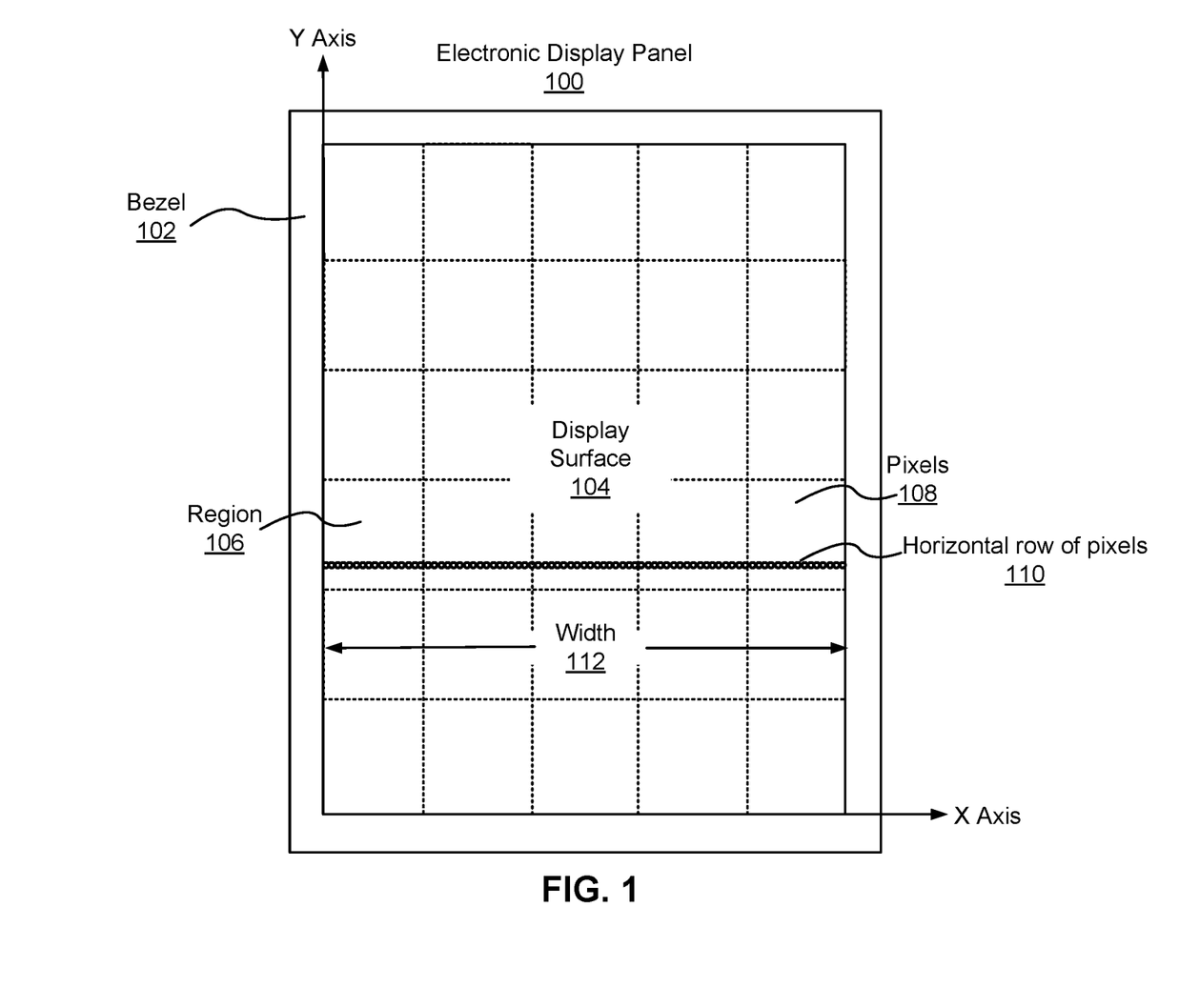
FIG. 1 is a planar view of an example electronic display panel, in accordance with an embodiment.

FIG. 1 is a planar view of an example electronic display panel 100 in accordance with an embodiment. The planar view includes a display surface 104, a region 106 of pixels among other regions, pixels 108, a horizontal row of pixels 110, a bezel 102, and a width 112. The electronic display panel 100 may be a liquid crystal display (LCD), organic light-emitting diode (OLED), active matrix organic light-emitting diode (AMOLED), etc. In an LCD electronic display panel 100, the light-modulating properties of liquid crystals display arbitrary images (as in a general-purpose computer display) or fixed images with low information content, such as preset words, digits, and 7-segment displays, as in a digital clock on the display surface 104. Each pixel of the LCD electronic display panel 100 typically consists of a layer of molecules aligned between two transparent electrodes, and two polarizing filters (parallel and perpendicular). By controlling the voltage applied across the liquid crystal layer in each pixel, light can be allowed to pass through in varying amounts thus constituting different levels of gray.

In an OLED electronic display panel 100, an emissive electroluminescent layer (a film of organic compound) emits light in response to an electric current. This layer of organic semiconductor is situated between two electrodes; typically, at least one of these electrodes is transparent. In an AMOLED electronic display panel 100, an active matrix of OLED pixels 108 that are deposited or integrated onto a TFT array, which functions as a series of switches to control the current flowing to each individual pixel, generates light (luminescence) upon electrical activation.

The display surface 104 shown in FIG. 1 is the physical area where pictures and videos are displayed. The length of the display surface 104 is the dimension along the vertical Y axis. The width 112 defines a dimension of the display surface 104 along the horizontal X axis. The pixels of the display surface 104 may be arranged in a regular two-dimensional grid of regions, e.g., region 106, on the display surface 104. Each region of the display surface 104 may have one or more pixels. Pixels 108 lie within a region of the display surface 104. A horizontal row 110 of pixels beginning at region 106 is shown arranged across five regions of pixels of the display surface 104. The bezel 102 shown in FIG. 1 is a non-display area that surrounds the display surface 104.

Although a rectangular display panel is illustrated in FIG. 1, other display panels may be circular, curved or of an arbitrary shape.

Example Display Panel Characteristics

Non-uniformities may exist across the display surface 104 of an electronic display panel 100. For example, non-uniformities may arise due to one or more of: threshold voltage variation of thin-film transistors (TFTs) that drive pixels of the electronic display panel, mobility variation of the TFTs, aspect ratio variations in the TFT fabrication process, power supply voltage variations across panels (e.g., IR-drop on panel power supply voltage line), and age-based degradation. The non-uniformities may include TFT fabrication process variations from lot-to-lot (e.g., from one lot of wafers used for fabricating the TFTs to another lot of wafers) and/or TFT fabrication process variations within a single lot of (e.g., die-to-die variations on a given wafer within a lot of wafers). The nature of non-uniformity may include intensity (i.e., brightness or luminance) and chrominance.

Figure 2:
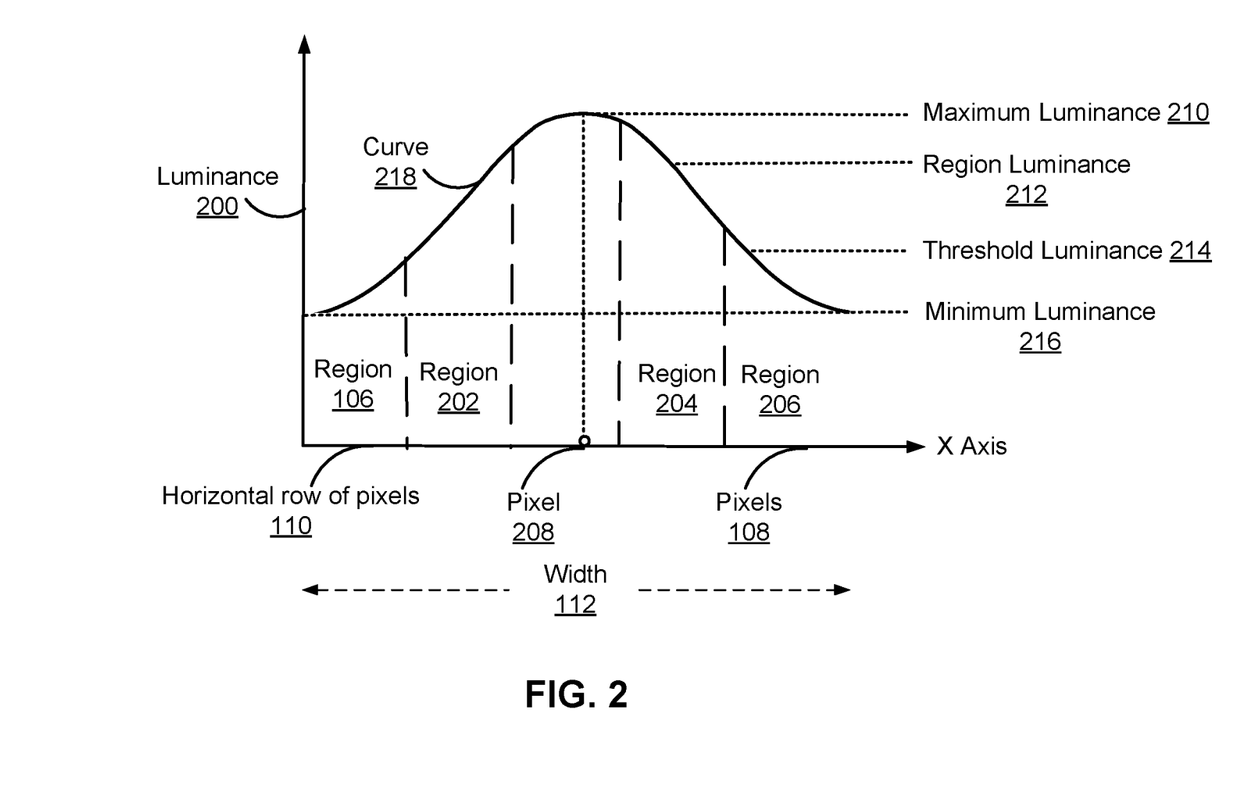
FIG. 2 is an example graphical representation of characteristics of an electronic display panel, in accordance with an embodiment.

FIG. 2 is an example graphical representation of characteristics of pixels of a display surface 104 of an electronic display panel 100, in accordance with an embodiment. In the example graphical representation, the parameter of light measured is luminance. Other parameters such as radiance and chrominance may be measured and illustrated similarly. The graphical representation includes a vertical luminance axis 200 representing luminance values of pixels and a horizontal X axis that represents pixel locations arranged along a horizontal row 110 of the display surface 104. The width 112 of the display surface 104 (equaling the length of the horizontal row 110) is shown on the X axis.

A curve 218 plots the luminance of pixels across the horizontal row 110. The horizontal row of pixels 110 is arranged across five regions of the display surface 104, i.e., region 106, region 202, region 204, region 206, and one unlabeled region. The pixels 108 lie within region 206. A pixel 208 is located on the horizontal row of pixels 110 within the unlabeled region between regions 202 and 204. In FIG. 2, pixel 208 is measured as having the maximum luminance 210 on the horizontal row of pixels 110. Pixel 208 may be selected by the system for altering its characteristics using a laser beam to reduce the luminance of pixel 208.

A parameter of light emitted by pixels may be measured by a measuring device, as described below with reference to FIG. 3. Measuring a parameter of light emitted by a region of pixels may be accomplished by measuring the parameter of light emitted by each pixel of the region and determining an average of the measured parameter of light across pixels of the pixels of the region. For example, the luminance of different regions of the display surface 104 shown in FIG. 2 may be measured and compared using a measure called the log-average luminance of a region. The log-average luminance of a region, e.g., region 206, may be determined as the geometric mean of the luminance of all pixels 108 in the region 206. The region luminance 212 shown in FIG. 2 corresponds to the measured luminance for region 204 of the display surface 104 of the electronic display panel 100. Region luminance 212 may, therefore, represent the log-average luminance over all pixels of the region 204. The radiance and chrominance of pixels and regions of pixels may be determined similarly.

The minimum luminance 216 shown in FIG. 2 may represent the lowest luminance of a pixel across the horizontal row 110 or the lowest luminance of a pixel lying on the horizontal row 110 within a certain region, e.g., the lowest luminance of pixels lying on the horizontal row 110 within region 206.

The system selects one or more pixels or one or more regions of the display panel 100 such that the measured parameter of light emitted by the one or more pixels or the one or more regions exceeds a threshold value, e.g., if a region or pixel is too bright. The threshold value may be a function of the average of the measured parameter of light across all the pixels (log-average luminance) of the display panel. The threshold value may increase as the average of the measured parameter of light across all the pixels of the display panel (the log-average luminance of the entire display surface 104) increases and the threshold value may decrease as the average of the measured parameter of light decreases. This is to treat too-bright pixels to decrease non-uniformities of the display surface 104. The system emits a laser beam by a laser device, onto the selected one or more pixels or the selected one or more regions to treat them. For example, the pixel 208 having a measured parameter value exceeding the threshold value may be treated with the laser beam. In embodiments, the threshold value may be a fixed value of a parameter of light. In embodiments, the threshold value may be a function of the minimum luminance across a row of pixels or region of pixels. The threshold value may increase as the minimum luminance across a row of pixels or region of pixels, e.g., minimum luminance 216, increases and the threshold value may decrease as the minimum luminance decreases. In embodiments, the threshold value may be determined from the average parameter value of pixels across one or more particular regions of the display surface 104, e.g., region luminance 212 of region 204. For example, the threshold value may be a function of the log-average luminance of region 204.

Example System for Treating Display Panel

Figure 3:
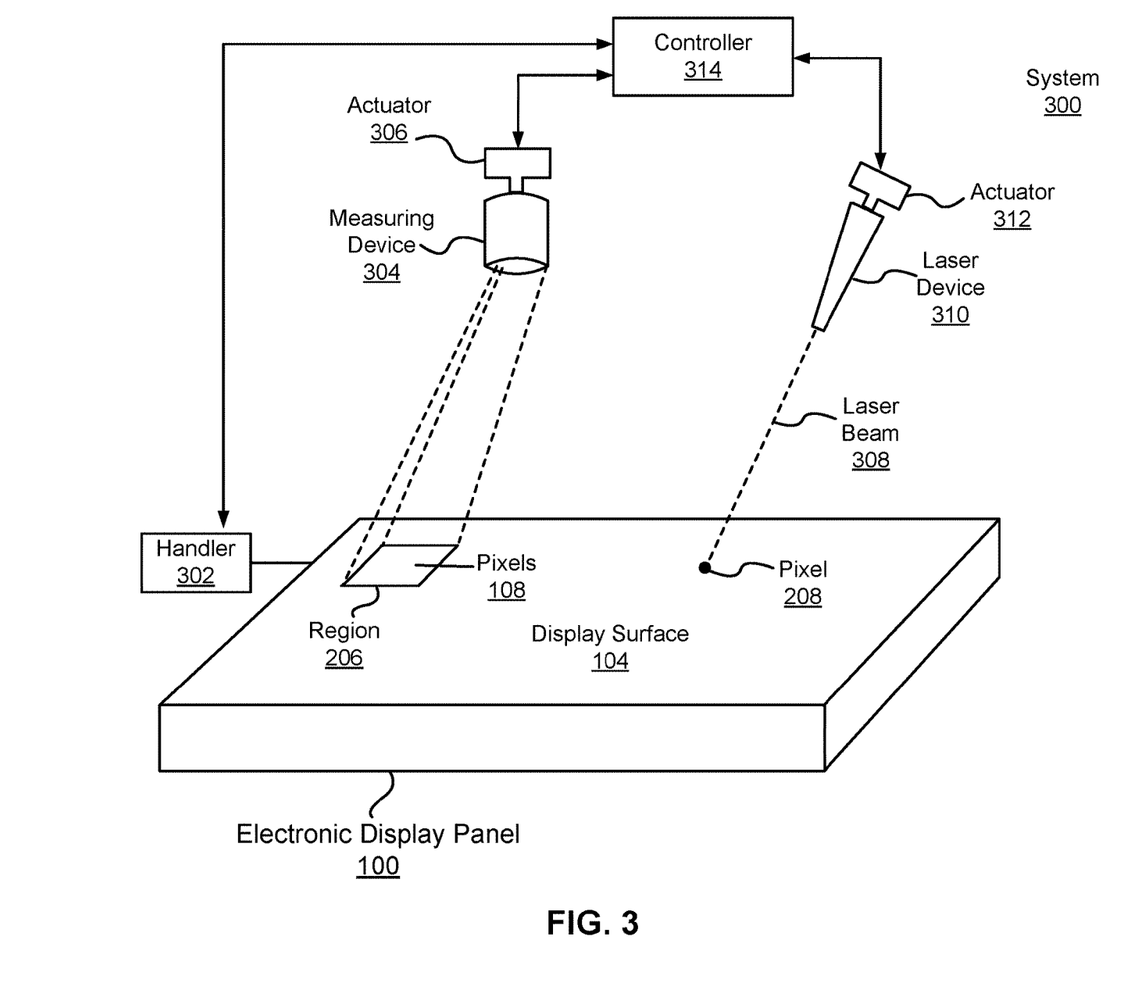
FIG. 3 is a schematic perspective view of an example system for treating an electronic display panel using a laser beam, in accordance with an embodiment.

FIG. 3 is a schematic perspective view of an example system 300 for treating an electronic display panel 100 using a laser, in accordance with an embodiment. The example system 300 may include, among other components, a handler 302, a measuring device 304, a laser device 310, and a controller 314. In embodiments, the system 300 performs treatment on pixels or regions of the electronic display panel 100 to alter the light emission characteristics of the pixels or regions. Specifically, the location of the pixels or regions may be determined based on whether a measured parameter of light emitted by the pixels or a region exceeds a threshold value. The controller 314 shown in FIG. 3 may interface with the handler 302 to physically position the electronic display panel 100 for laser treatment. The handler 302 may interact with an interlocking mechanism on the assembly line to position each electronic display panel 100 to measure parameters of light emitted by its pixels. The controller 314 is illustrated and described in detail below with reference to FIG. 4.

The measuring device 304 shown in FIG. 3 measures a parameter of light emitted by pixels or regions of the electronic display panel 100. In an embodiment, the parameter of light may be luminance, radiance, or chrominance. The measuring device 304 may include, for example, a photometer, a photodiode, a radiometer or a colorimeter to measure a desired parameter. A photometer is an instrument that measures light intensity or luminance of the pixels by counting individual photons or measuring the incoming flux. A photodiode is a semiconductor device that converts light from the pixels into current when photons are absorbed in the photodiode such that a measure of the current may be used to estimate the light intensity emitted by the pixels. A radiometer is a device for measuring the radiant flux of electromagnetic radiation. A colorimeter may be used to take wideband spectral energy readings along the visible spectrum by using filtered photodetectors to measure X-Y chromaticity coordinates of the display surface 104 in red, green, blue and white colors.

The actuator 306 is operated by the controller 314 to move the measuring device 304 in a direction parallel to the display surface 104 of the electronic display panel 100. The actuator 306 receives a control signal from the controller 314 in the form of electric voltage, current, pneumatic, hydraulic pressure, etc. When the control signal is received, the actuator 306 responds by converting the control signal into mechanical motion. Once the handler 302 positions the electronic display panel 100 below the measuring device 304, the actuator 306 moves the measuring device 304 over the electronic display panel 100 to measure parameters of light emitted by different pixels and regions. The position of the measuring device 304 may be tracked by motion sensors as it moves above the electronic display panel 100.

The laser device 310 emits the laser beam 308 onto individual pixels or a region of pixels selected by the system to alter the light emission characteristics of the pixels or region. The laser device 310 shown in FIG. 3 is operated by the controller 314 to control the properties of the emitted laser beam 308, such as the polarization, wavelength, and shape of the laser beam 308. The controller 314 and actuator 312 may control the laser beam 318 to incident on an individual pixel, e.g., 208, or a region 206 of pixels 108 to treat the pixel 208 or the region 206 by adjusting an actuator 312 connected to the laser device 310.

Example Application for Two Display Panels

In certain applications, two display panels are used to form stereoscopic images. For example, in a head-mounted display, two separate display panels, one for the left eye and another for the right eye, may be used to collectively form fused stereoscopic images. In such applications, the mismatch of light emitting characteristics of two corresponding pixels or spatial regions in both display panels becomes more noticeable. Hence, in such applications, it is desirable to have the two display panels have similar light emitting characteristics at the same spatial regions.

Figure 4:
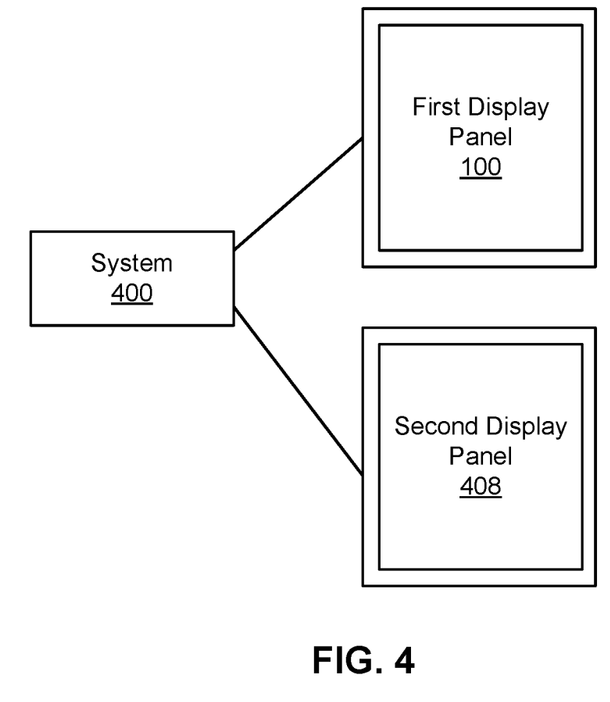
FIG. 4 is a block diagram of a system for treating light-emission property of a second display panel based on measured properties of a first display panel, in accordance with an embodiment.

FIG. 4 is a block diagram of a system for treating light-emission property of a second display panel 408 based on measured properties of a first display panel 100, in accordance with an embodiment. The system 400 has substantially the same structure and function as the system 300 of FIG. 3 except that system 400 further adjusts the properties of the second display panel 408 based on the measured properties of the first display panel 100.

In addition to or alternative to treating the surfaces of the first and the second display panels 100 and 408, individually, to have less degree of mismatch across different pixels and regions, the system 400 further reduces the mismatch of the light emitting characteristics between corresponding pixels and regions of the first and second display panels 100 and 408. In an embodiment, the controller 314 may cause the laser device 310 to emit light onto one or more pixels or one or more regions of the second display panel 408 for pairing with the first display panel 100 such that mismatch of the measured parameter of light emitted by pixels and regions in the second display panel 408 relative to the measured parameter of light emitted by corresponding pixels or regions in the display panel 100 is below a second threshold value. For this purpose, the system 400 may store the measured light emitting characteristics of the first display panel 100 after treating the first display panel 100, and then treat the second display panel 408 based on the stored light emitting characteristics of the second display panel 408.

Schematic Block Diagram of Example System

Figure 5:
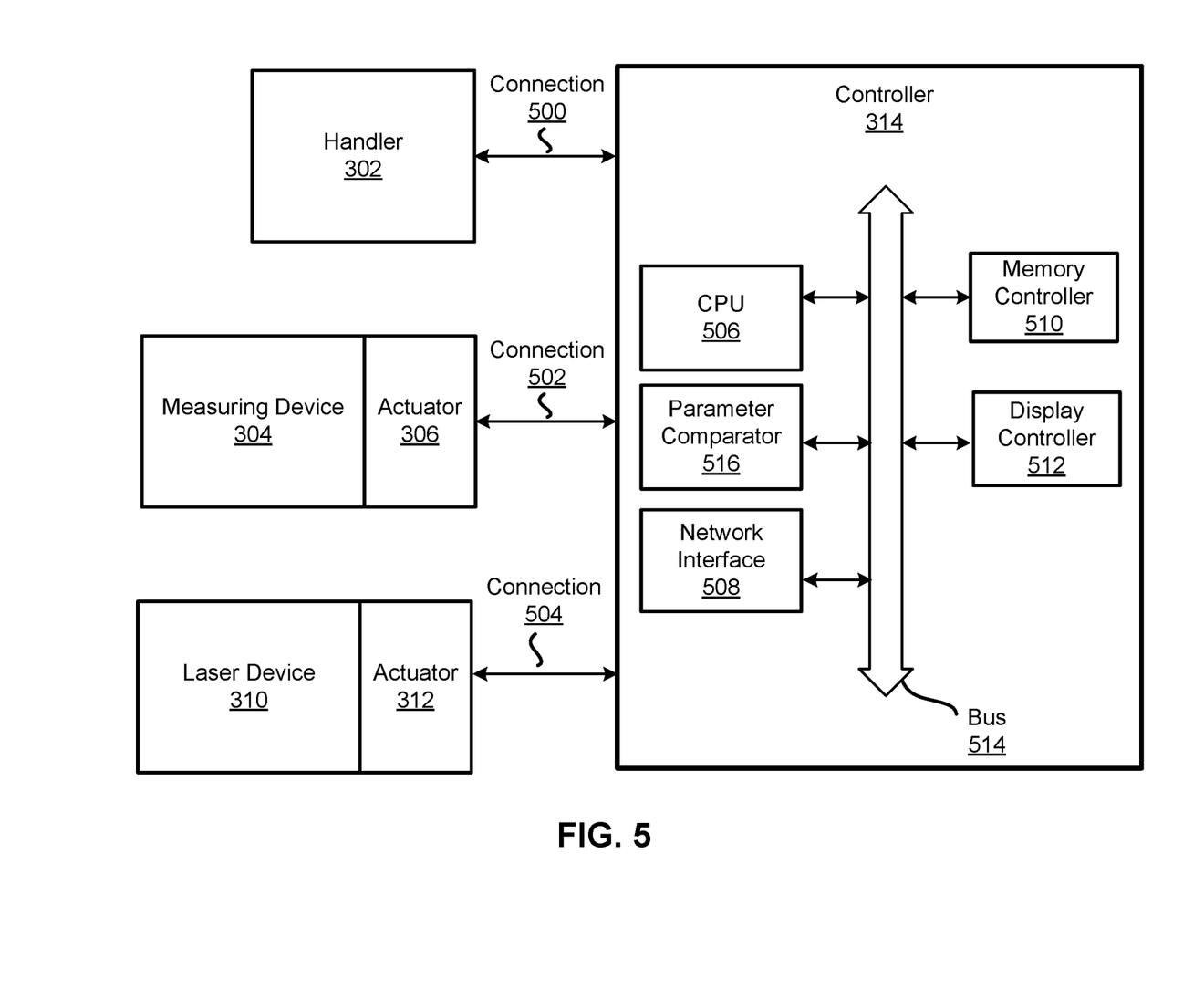
FIG. 5 is a schematic block diagram of an example system for treating an electronic display panel, in accordance with an embodiment.

FIG. 5 is a schematic block diagram of an example system for treating an electronic display panel 100, in accordance with an embodiment. The controller 314 shown in FIG. 5 may be a hardware device or software module connected over a wireless network or hardwired to the handler 302, actuator 306, and actuator 312, as described above with reference to FIG. 3. In alternative embodiments, the controller 314 operates as a standalone device or a connected (e.g., networked) device. The controller 314 may be a server computer, a client computer, a personal computer (PC), a tablet PC, or any machine capable of executing instructions (sequential or otherwise) that specify actions to be taken by the handler 302, actuator 306, and actuator 312.

The controller 314 may connect to and operate the handler 302, which physically positions the electronic display panel 100 on a moving assembly line of display panels, as described above with reference to FIG. 3. The controller 314 may connect to the handler 302 over connection 500, which may be configured wirelessly as a digital bit stream or a digitized analog signal over a point-to-point or point-to-multipoint communication channel, e.g., copper wires, optical fibers, wireless communication channels, storage media and computer buses.

The measuring device 304 measures a parameter of light emitted by one or more pixels of each region of the electronic display panel 100. The controller 314 may connect to and operate the actuator 306 to move the measuring device 304 in a direction parallel to the display surface 104 of the electronic display panel 100. The controller 314 may connect to the actuator 306 over connection 502, which may be configured wirelessly as a digital bit stream or a digitized analog signal over a point-to-point or point-to-multipoint communication channel, e.g., copper wires, optical fibers, wireless communication channels, storage media and computer buses.

The laser device 310 emits a laser beam onto pixels and regions of pixels selected by the system to alter the light emission characteristics of the pixels or region. The controller 314 may connect to the actuator 312 over connection 504, which may be configured wirelessly as a digital bit stream or a digitized analog signal over a point-to-point or point-to-multipoint communication channel, e.g., copper wires, optical fibers, wireless communication channels, storage media and computer buses.

The controller 314 may include one or more processing units (generally processor), for example, a central processing unit (CPU 506), parameter comparator 516, network interface 508, memory controller 510, display controller 512, etc. The controller 314 executes instructions, e.g., program code or software, for causing the handler 302, actuator 306, parameter comparator 516, and actuator 312 to perform any one or more of the methodologies (or processes) described herein. The CPU 506 may carry out the instructions of a computer program by performing the basic arithmetic, logical, control and input/output (I/O) operations specified by the instructions. The CPU 506 may be a microprocessor contained on a single integrated circuit (IC) chip.

The parameter comparator 516 is a computing device that may determines the threshold value for the parameter of light measured by the measuring device 304 based on the average of the measured parameter of light across all the pixels of the display panel 100. In embodiments, the threshold value may be determined as described above with reference to FIG. 4. The parameter comparator 516 further selects one or more pixels or one or more regions of the display panel 100, such that the measured parameter of light emitted by the one or more pixels or the one or more regions exceeds the threshold value. The system receives location information corresponding to the selected pixels or regions to be treated from the parameter comparator 516. The parameter comparator 516 may further select one or more pixels or one or more regions of a second display panel 408 for pairing with the display panel 100 such that mismatch of the measured parameter of light emitted by pixels and regions in the second display panel 408 relative to the measured parameter of light emitted by corresponding pixels or regions in the display panel 100 is below a second threshold value. The parameter comparator 516 may determine the second threshold value to decrease non-uniformities between corresponding pixels and corresponding regions of the two display panels 100 and 408. The parameter comparator 516 may include operational amplifiers (op amps), passive linear components, an oscilloscope, etc. The parameter comparator 516 may also include one or more processors, a digital signal processor (DSP), a main memory, a storage unit, etc.

The network interface 508 shown in FIG. 5 may be a dedicated hardware or software networking device supporting any of Ethernet, Fiber Channel, Wi-Fi, Token Ring, FireWire, etc. The network interface 508 receives information representing measured parameters of light and pixel locations from the measuring device 304 over connection 502. The network interface 508 may forward information representing locations of pixels and regions from the parameter comparator 516 via connection 504 to the laser device 310. The memory controller 510 may be a digital circuit that manages the flow of data going to and from the controller 314's main memory. The display controller 512 may be an integrated circuit that generates the timing of horizontal and vertical synchronization signals for the laser device 310 and the actuator 312 to treat pixel locations. The CPU 506, parameter comparator 516, network interface 508, memory controller 510, and display controller 512 may communicate via a bus 514.

Example Process

Figure 6:
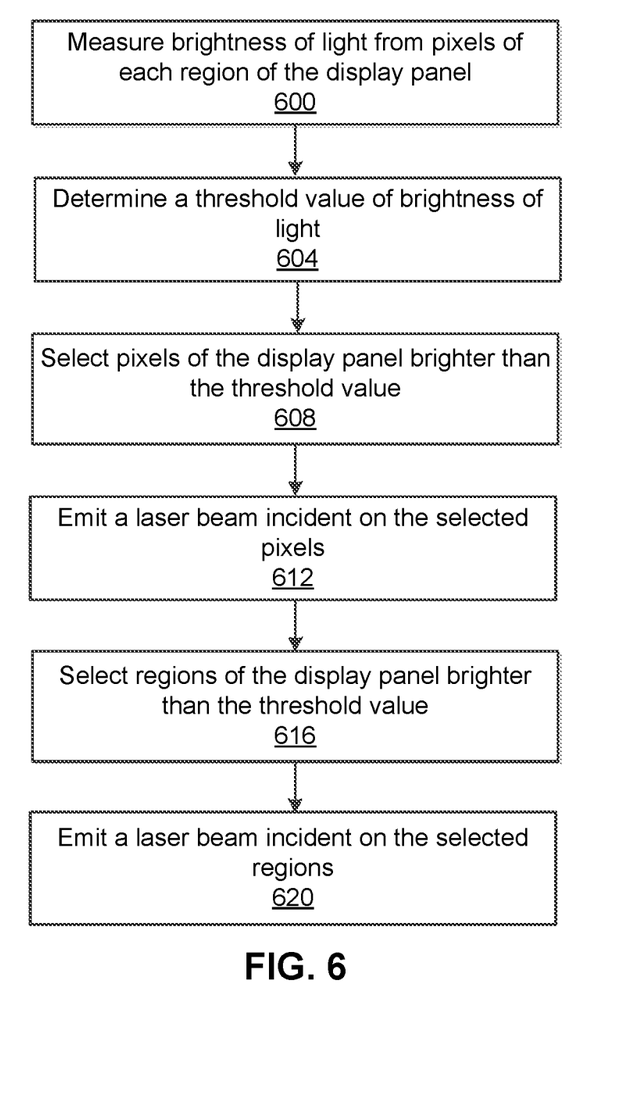
FIG. 6 is a flowchart illustrating an example process for treating an electronic display panel using a laser, in accordance with an embodiment.

FIG. 6 is a flowchart illustrating an example process for treating an electronic display panel 100 using a laser, in accordance with an embodiment. In some embodiments, the process may have different and/or additional steps than those described in conjunction with FIG. 6. Steps of the process may be performed in different orders than the order described in conjunction with FIG. 6. Some steps may be executed in parallel. Alternatively, some of the steps may be executed in parallel and some steps executed sequentially. Alternatively, some steps may execute in a pipelined fashion such that execution of a step is started before the execution of a previous step.

The system 300 measures 600 a parameter of light emitted by one or more pixels of each region of the electronic display panel 100 using the measuring device 304 and actuator 306. In embodiments, the system determines 604 a threshold value of the measured parameter of light, e.g., brightness. The system selects 608 pixels of the electronic display panel 100 having the measured parameter of light exceeding the threshold value using the parameter comparator 516 as described above in detail with reference to FIG. 5. The controller 314 operates the actuator 312 to cause the laser device 310 to emit 612 the laser beam 308 onto the selected pixels of the electronic display panel 100 to treat the selected pixels. Such treatment burns the selected pixels and makes these pixels dimmer. For example, the laser beam 308 may degrade the electron/hole mobility in the selected pixels or may reduce the performance of organic emitters in the selected pixels.

After treating individual pixels, the system selects 616 a region of the electronic display panel 100 having the measured parameter of light exceeding the threshold value using the parameter comparator 516 as described above. The controller 314 operates the actuator 312 to cause the laser device 310 to emit 620 the laser beam 308 incident on the selected region of the electronic display panel 100 to treat the selected region to alter its characteristics and improve uniformity of the display surface 104.

The foregoing description of the embodiments has been presented for the purpose of illustration; it is not intended to be exhaustive or to limit the invention to the precise forms disclosed.

Finally, the language used in the specification has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the embodiments is intended to be illustrative, but not limiting, of the scope, which is set forth in the following claims.

What is claimed is:

1. An apparatus for treating regions of a display panel, the apparatus comprising:
    a measuring device configured to measure a parameter of light emitted by one or more regions of the display panel, each of the one or more regions comprising a plurality of pixels;
    a controller operably coupled to the measuring device and configured to:
        determine an average of the parameter of light emitted by the one or more regions, each region comprising a plurality of pixels;
        determine a threshold value according to the determined average;
        identify a specific region of the one or more region that has the parameter of light exceeding the threshold value;
        determine a shape of a laser beam to treat the identified region; and
        generate a control signal indicating the shape of the laser beam; and
    a laser device operably coupled to the controller to receive the control signal and configured to emit the laser beam according to the control signal onto the identified region.

2. The apparatus of claim 1, further comprising:
    an actuator operably coupled to the laser device and operated by the controller to cause the laser device to emit the laser beam onto the identified region.

3. The apparatus of claim 1, wherein the measuring device is one of a photometer, a photodiode, a radiometer, or a colorimeter.

4. The apparatus of claim 1, wherein the parameter of light is at least one of luminance, radiance, and chrominance.

5. The apparatus of claim 1, further comprising an actuator operated by the controller to move the measuring device in a direction parallel to a display surface of the display panel.

6. The apparatus of claim 1, further comprising:
    an actuator operably coupled to the controller, wherein the controller operates the laser device using the actuator to perform a plurality of cycles of treatment on the display panel, the laser device emitting the laser beam onto regions of different sizes in at least two of the plurality of cycles.

7. The apparatus of claim 1, further comprising:
    an actuator operably coupled to the controller, wherein the threshold value increases as the average of the measured parameter of light across all the regions of the display panel increases.

8. The apparatus of claim 1, further comprising:
    an actuator operably coupled to the controller, wherein the controller is further configured to cause the laser device to emit light onto one or more regions of a second display panel for pairing with the display panel such that mismatch of the measured parameter of light emitted by regions in the second display panel relative to the measured parameter of light emitted by corresponding regions in the display panel is below a second threshold value.

9. The apparatus of claim 1, wherein the shape of the laser beam corresponds to a shape of the region.

10. The apparatus of claim 1, further comprising:
    an actuator operably coupled to the laser device to cause the laser device to emit the laser beam according to location information corresponding to the identified region, wherein the controller is further configured to receive the location information corresponding to the identified region.

11. The apparatus of claim 1, wherein the control signal indicates a polarization of the laser beam.

12. The apparatus of claim 1, wherein the control signal indicates a wavelength of the laser beam.

* * * * *